US010818824B2

(12) United States Patent
Hirosaki

(10) Patent No.: US 10,818,824 B2
(45) Date of Patent: Oct. 27, 2020

(54) LIGHT-EMITTING INSTRUMENT AND IMAGE DISPLAY DEVICE

(71) Applicant: National Institute for Materials Science, Ibaraki (JP)

(72) Inventor: Naoto Hirosaki, Ibaraki (JP)

(73) Assignee: National Institute for Materials Science, Tsukuba-shi (JP)

(*) Notice: Subject to any disclaimer, the term of this patent is extended or adjusted under 35 U.S.C. 154(b) by 522 days.

(21) Appl. No.: 15/574,136

(22) PCT Filed: May 13, 2016

(86) PCT No.: PCT/JP2016/064388
§ 371 (c)(1),
(2) Date: Nov. 14, 2017

(87) PCT Pub. No.: WO2016/186058
PCT Pub. Date: Nov. 24, 2016

(65) Prior Publication Data
US 2018/0127647 A1 May 10, 2018

(30) Foreign Application Priority Data
May 15, 2015 (JP) ................. 2015-100482

(51) Int. Cl.
*H01L 33/50* (2010.01)
*C09K 11/64* (2006.01)
(Continued)

(52) U.S. Cl.
CPC ............. *H01L 33/50* (2013.01); *C09K 11/57* (2013.01); *C09K 11/616* (2013.01);
(Continued)

(58) Field of Classification Search
CPC ...... C09K 11/64; C09K 11/616; C09K 11/617; C09K 11/57; F21K 9/60; H01L 33/502; H01L 33/504
See application file for complete search history.

(56) References Cited

U.S. PATENT DOCUMENTS 8,409,470 B2 * 4/2013 Hirosaki ............. C09K 11/646
252/301.4 F
10,381,528 B2 * 8/2019 Yoshimura ............. C09K 11/57
(Continued)

FOREIGN PATENT DOCUMENTS

JP 2009-96854 * 5/2009
JP 2009-96854 A 5/2009

OTHER PUBLICATIONS

Xie et al, "Crystal Structure and Photoluminescence of Mn+2—Mg+2 codoped gamma aluminum oxynitride (g-AlON): A promising green phosphor for white-light emitting diodes", Applied Physics Letters, 92, (2008), May 2019, 1-3, May 20, 2008.*
(Continued)

*Primary Examiner* — C Melissa Koslow
(74) *Attorney, Agent, or Firm* — Trojan Law Offices

(57) ABSTRACT

Provided are a light-emitting instrument, and an image display device utilizing an AlON phosphor and having wide color gamut. The light-emitting instrument includes an emission source emitting light having a wavelength from 410 nm to 470 nm and a phosphor or a light-transmitting body where the phosphor is dispersed, and the phosphor includes an inorganic compound where an AlON crystal, an AlON solid solution crystal, or an inorganic crystal having a crystal structure identical to AlON includes at least Mn, an A element (a monovalent metal element) it necessary, a D element (a divalent metal element) if necessary, an E element (a monovalent anion) if necessary, and a G element (one or more elements other than Mn, the A, Al, O, N, the
(Continued)

D, or the E) if necessary, and emits fluorescence having a peak wavelength from 515 nm to 541 nm upon irradiation of an excitation source.

10 Claims, 3 Drawing Sheets

(51) Int. Cl.
    *C09K 11/61*     (2006.01)
    *C09K 11/57*     (2006.01)
    *F21K 9/60*     (2016.01)
    *H01S 3/00*     (2006.01)
    *G09F 13/22*     (2006.01)
(52) U.S. Cl.
    CPC ............ *C09K 11/617* (2013.01); *C09K 11/64* (2013.01); *F21K 9/60* (2016.08); *H01L 33/502* (2013.01); *H01L 33/504* (2013.01); *H01S 3/0078* (2013.01); *G09F 2013/222* (2013.01)

(56) References Cited

U.S. PATENT DOCUMENTS

| | | | |
|---|---|---|---|
| 10,381,529 B2* | 8/2019 | Yoshimura | C09K 11/0883 |
| 10,662,374 B2* | 5/2020 | Hirosaki | C09K 11/64 |
| 2009/0121608 A1 | 5/2009 | Nims | |
| 2010/0091215 A1* | 4/2010 | Fukunaga | H05B 33/14 |
| | | | 349/61 |

OTHER PUBLICATIONS

Translation for JP 2009-96854, May 7, 2009.*
Supplementary European Search Report, dated Apr. 5, 2018, European Patent Office.
H. X. Willem, et al., "Neutron Diffraction of y-aluminium oxynitride," Journal of Materials Sciences Letters, vol. 12, pp. 1470-1472 (1993).
ICSD No. 70032; ICSD (Inorganic crystal structure database) (published by Fachinformationszentrum Karlsruhe, Germany).

* cited by examiner

LIGHT-EMITTING INSTRUMENT AND IMAGE DISPLAY DEVICE

TECHNICAL FIELD

The present invention relates to a light-emitting instrument and an image display device utilizing a phosphor having, as a host crystal, an AlON (aluminum oxynitride) crystal, an AlON solid solution crystal, or an inorganic crystal having a crystal structure identical to that of the AlON crystal. In more detail, it relates to a light-emitting instrument and an image display device, in which characteristics of a phosphor emitting light having a peak at the wavelength from 490 nm to 550 (550 nm or less) are utilized.

BACKGROUND ART

The phosphor is utilized in a fluorescent display tube (VFD: Vacuum-Fluorescent Display), a field emission display (FED: Field Emission Display or SED; Surface-Conduction Electron-Emitter Display), a plasma display panel (PDP: Plasma Display Panel), a cathode-ray tube (CRT: Cathode-Ray Tube), a liquid-crystal display backlight (Liquid-Crystal Display Backlight), a white light-emitting diode (LED; Light-Emitting Diode), and so on. In any of these applications, it is necessary to provide the phosphor with energy to excite the phosphor in order to make the phosphor emit fluorescence and the phosphor is excited by an excitation source with high energy such as a vacuum ultraviolet ray, an ultraviolet ray, an electron beam, and blue light so as to emit a visible light ray such as blue light, green light, yellow light, orange light, and red light. However, as a result of the phosphor being exposed to such excitation source, the luminance of the phosphor tends to decrease and a phosphor having little degradation in the brightness is desired. Therefore, a phosphor having an inorganic crystal containing nitrogen in a crystal structure thereof as a host crystal, instead a phosphor such as a silicate phosphor, a phosphate phosphor, an aluminate phosphor, and a sulfide phosphor, has been proposed, as exemplified by a sialon phosphor, an oxynitride phosphor, or a nitride phosphor, which is characterized by low brightness deterioration caused by high energy excitation.

As one example of such an oxynitride phosphor, a phosphor in which an AlON crystal is activated by Mn is known (for example, refer to Patent Reference 1). This phosphor emits green light with high color purity having a peak from 510 to 520 nm and a narrow half width of the spectrum when it is excited by an ultraviolet ray, blue light, or an electron beam. Therefore, it is suitable as a green phosphor for the image display device.

Further, if Mg is added to the AlON crystal, it is reported that excitation characteristics by blue light of 440 nm to 460 nm may be improved (for example, refer to Patent Reference 2).

However, even though a phosphor in which the AlON crystal was activated by Mn exhibited high color purity oil green, it could not be said that the excitation characteristics by blue light of 440 nm to 449 nm (also referred to as "blue light excitation characteristics") were sufficient. Although the blue light excitation characteristics were improved when Mg was added to the AlON crystal, further improvement of the emission intensity was also in demand.

On the other hand, only three colors of red, green, and blue are necessary for the application of display, but no other color components are necessary such that three kinds of phosphors which emit red light, green light, and blue light having sharp spectra, respectively, are necessary for back light used for the application. In particular, a green phosphor exhibiting a sharp spectrum of emission with high color purity could hardly be found. Expansion of color gamut of the light-emitting instrument and the image display device utilizing such an AlON phosphor is desired.

PRIOR ART REFERENCES

Patent References

[Patent Reference 1] International Publication No. WO 2007/099862.
[Patent Reference 2] Japanese Patent No. 5224439.

Non-Patent Reference

[Non-Patent Reference 1]
H. X. Willem, et al., "Newtron diffraction of γ-aluminium oxynitride," Journal of materials science letters, vol. 12, pp. 1470-1472 (1393).
[Non-Patent Reference 2]
ICSD No. 70032; ICSD (Inorganic crystal structure database) (published by Fachinforntationszentrura Karlsruhe, Germany).

SUMMARY OF THE INVENTION

Problem to be Solved by the Invention

It is an object of the present invention to try to satisfy such demand and to provide a light-emitting instrument and an image display device utilizing an AlON phosphor and having a wide color gamut. In more detail, it is an object of the present invention to provide a light-emitting instrument and an image display device utilizing a phosphor having excellent emission characteristics especially in comparison to the AlON phosphor by blue light that has 410 nm or longer wavelength and has 470 nm or shorter wavelength.

Means to Solve the Problem

The present inventor has found, under such circumstances, that some of those, in which an AlON crystal has a specific composition range and a specific amount of Mn is solid-solved into the crystal, has improved excitation characteristics by blue light of 440 nm to 450 nm. In particular, it has been found that a phosphor having a specific composition range may have high, emission efficiency by blue light excitation and emit green light with high color purity so as to be suitable for an illumination application and an image display device.

As a result of further intensive investigations on the basis of this discovery, a light-emitting instrument, and an image display device having excellent characteristics by utilizing a phosphor that shows a luminous phenomenon with high intensity in a specific wavelength range have been successfully provided. They will be more specifically described in the following.

A light-emitting instrument according to the present invention comprises at least an emission source that emits light having a wavelength of 410 nm or longer and 470 nm or shorter and a phosphor or a light transmitting body in which a phosphor is dispersed wherein the phosphor includes an inorganic compound in which an AlON crystal, an AlON solid solution crystal, or an inorganic crystal having an identical crystal structure to that of the AlON crystal includes at least Mn, an A element if necessary (where the A element is a monovalent metal element), a D element if necessary (where the D element is a divalent metal element), an E element if necessary (where the E element is a monovalent anion), and a G element if necessary (where the G element is one or two or more kinds of elements other than Mn, the A element, Al, O, N, the D element, and the E element) and emits fluorescence having a peak at a wavelength in a range from 515 nm to 541 nm upon irradiation of the excitation source, whereby the above-mentioned problem is solved.

The above-mentioned phosphor may be represented by a composition formula: $Mn_aA_bAl_cO_dN_eD_fE_gG_h$ (where $a+b+c+d+e+f+g+h=1$ in the formula) and the parameters: a, b, c, d, e, f, g, and h satisfy:

$0.0003 \leq a \leq 0.09$, $0 \leq b \leq 0.24$, $0.25 \leq c \leq 0.41$, $0.35 \leq d \leq 0.56$, $0.02 \leq e \leq 0.13$, $0 \leq f \leq 0.10$, $0 \leq g \leq 0.20$, and $0 \leq h \leq 0.10$.

The above-mentioned A element is Li and the above-mentioned parameter: a may satisfy $0.005 \leq a \leq 0.025$.

The above-mentioned D element is Mg and the above-mentioned parameter; f may satisfy $0.001 \leq f \leq 0.09$.

The above-mentioned E element is F and the above-mentioned parameter: g may satisfy $0.001 \leq g \leq 0.17$.

The above-mentioned parameter: h may satisfy h=0.

The above-mentioned emission, source may be an LED (light-emitting diode) or an LD (laser diode) to emit light having a peak at a wavelength in a range from 430 to 460 nm.

The above-mentioned emission source may be an LED (light-emitting diode) or an LD (laser diode) to emit light having a peak at a wavelength in a range from 440 to 460 nm and the phosphor may emit fluorescence having a peak at a wavelength in a range of 518 nm or longer and 530 nm or shorter upon irradiation of the excitation source.

The above-mentioned phosphor may further include a red phosphor to emit light having a peak at a wavelength in a range of 620 nm or longer and 670 nm or shorter.

The above-mentioned red phosphor may be a phosphor activated by $Mn^{4+}$.

The above-mentioned red phosphor may be KSF and/or KSNAF.

An image display device of the present application utilizes at least the above-mentioned light-emitting instrument as a backlight whereby the above-mentioned problem is solved.

Effect of the Invention

A phosphor utilized in a light-emitting instrument and an image display device of the present invention includes, as a main component, an inorganic compound including an AlON crystal, an AlON solid solution crystal, or an inorganic crystal having the same crystal structure as the AlON crystal, which includes Mn (where $Mn^{2+}$ is preferable) as a metal ion to serve as a luminescence center, whereby green light with high color purity having a peak at a wavelength in a range of 490 nm or longer and 550 nm or shorter may be emitted. A phosphor having a specific composition according to the present invention is excellent in blue light excitation characteristics to emit fluorescence having a peak at a wavelength in a range of 515 nm or longer and 541 nm or shorter upon irradiation of excitation light having a wavelength of 410 nm or longer and 470 nm or shorter. The light-emitting instrument having such a phosphor and the image display device utilizing it are advantageous since the color gamut is wide and the color reproducibility is excellent. In particular, it is useful for an LED for backlight of a liquid crystal television and a mobile terminal.

EMBODIMENT FOR CARRYING OUT THE INVENTION

Figure 1:
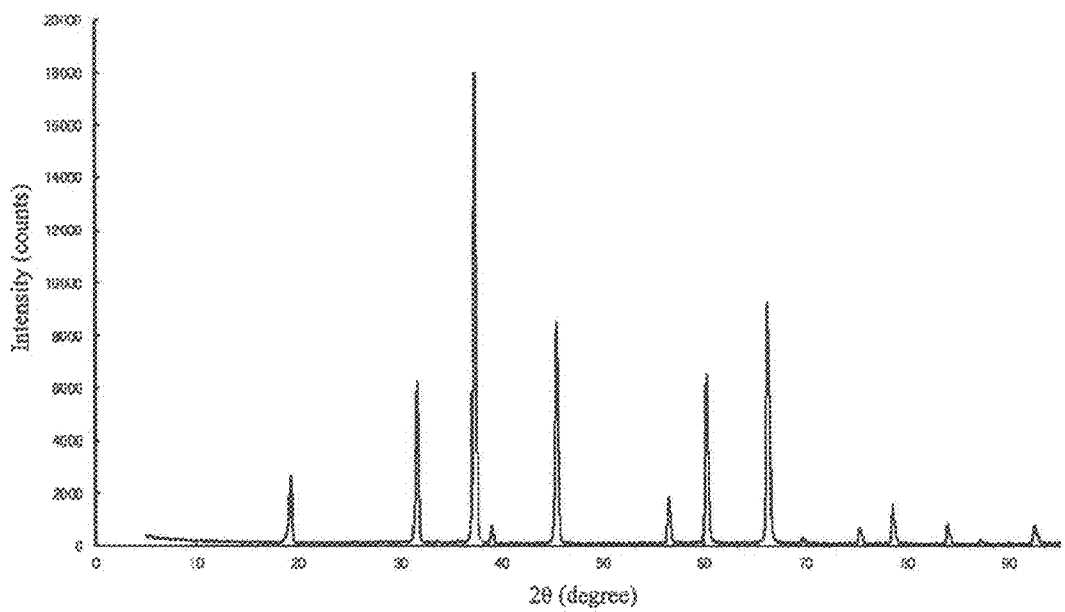
FIG. 1 is a diagram showing an XRD pattern of an inorganic compound of Example 1.

In the following, embodiments of the present invention are described in detail.

A light-emitting instrument of the present invention comprises an emission source to emit light having a wavelength of 410 nm or longer and 170 nm or shorter and a phosphor or a light transmitting body in which the phosphor is dispersed. Here, the above-mentioned phosphor comprises an inorganic compound in which an AlON crystal, an AlON solid solution crystal, or an inorganic crystal having the identical crystal structure to that of the AlON crystal contains at least Mn, an A element if necessary (where the A element is a monovalent metal element), a D element if necessary (where the D element is a divalent metal element), an E element if necessary (where the E element is a monovalent anion), and a G element if necessary (where the G element is one or two or more kinds of elements other than Mn, the A element. Al, O, N, the D element, and the E element) and emits fluorescence having a peak at a wavelength in a range from 515 nm to 541 nm upon irradiation of the excitation source.

Firstly, a phosphor utilized in the light-emitting instrument will be explained.

A phosphor of the present invention may include, as a main component, an inorganic compound in which an AlON crystal, an AlON solid solution crystal, or an inorganic crystal having the identical crystal structure to that of the AlON crystal contains at least Mn.

The AlON crystal is a crystal having a cubic spinel-type crystal structure and is also called γ-AlON as described in Non-patent documents 1 and 2 (The entire contents of Non-patent References 1 and 2 are incorporated herein by reference.). This crystal is synthesized by mixing AlN and $Al_2O_3$ being added thereto, and firing a mixture thereof at 1850° C.

The AlON solid solution crystal is a crystal in which, while the crystal structure of the AlON crystal is maintained, a ratio of oxygen/nitrogen is changed and/or a crystal to which another element is added. The other element to be added may include silicon, Mg, F, and so on.

The inorganic crystal having the identical crystal structure to that of the AXON crystal is a crystal in which Al, O, and N are partially or completely substituted with other elements while the crystal structure of the AlON crystal is maintained.

In the present invention, the above crystals may be used as host crystals. The AlON crystal or the AlON solid solution crystal can be identified by the X-ray diffraction and the neutron diffraction methods. Details of the crystal structure are described in Non-patent references 1 and 2 and the crystal structure and the X-ray diffraction pattern are unambiguously determined from data such as the lattice constants, the space group, and the atomic positions which are described in the references. Also, in addition to the substance exhibiting the same diffraction pattern as that of the pure AlON crystal or the AXON solid solution crystal, the inorganic crystal having the identical crystal structure to that of the AlON crystal in which the lattice constants are changed by substituting the constituent elements with other elements can be identified and included as part of the present invention.

The phosphor includes, as the main component, the inorganic compound in which Mn, as an optically activating metal element, is included into the AlON crystal, the AlON solid solution crystal, or the inorganic crystal having the identical crystal structure to that of the AlON crystal, thereby allowing it to be a phospor having green color emission characteristics.

The phosphor of the present invention includes, as the main component, the inorganic compound in which the A element (where the A element is a monovalent metal element) is further included into the AlON crystal, the AlON solid solution crystal, or the inorganic crystal having the identical crystal structure to that of the AlON crystal, in which Mn is preferably included, thereby allowing it to be a phosphor having excellent emission characteristics. The monovalent metal is readily solid-solved into the host crystal such as the AlON crystal. And hence the crystal structure is stabilized such that $Mn^{2+}$ can stably remain in the crystal of the thus-stabilized crystal structure. And these ions get easily incorporated into the crystal. In this way, brightness of the phosphor can be improved. In particular, this effect is great when the A element is Li such that it is preferable that the A element is Li in order to make the emission characteristics improved.

The phosphor of the present invention includes, as the main component, the inorganic compound in which the D element (where the D element is a divalent metal element) is further included into the AlON crystal, the AlON solid solution crystal, or the inorganic crystal having the identical crystal structure to that of the AlON crystal, in which Mn and the A element (where the A element is a monovalent metal element) are more preferably included, thereby allowing the phosphor to exhibit further excellent emission characteristics. The divalent metal element is readily solid solved into the host crystal such as the AlON crystal. And hence the crystal structure is stabilized such that $Mn^{2+}$ can stably remain in the crystal of the thus-stabilized crystal structure. And these ions get easily incorporated into the crystal. In this way, brightness of the phosphor can be further improved. In particular, this effect is great when the D element is Mg such that it is preferable that the D element is Mg in order to make the emission characteristics improved.

It is preferable that the composition range is represented by a composition formula $Mn_aA_bAl_cO_dN_eD_fE_gG_h$ (where it is assumed that $a+b+c+d+e+f+g+h=1$ in the formula) and the parameters a, b, c, d, e, and f are selected from values that satisfy all the following condition. Here, the A element is a monovalent metal element; the D element is a divalent metal element; the E element is a monovalent anion element; the G element is one or two or more kinds of elements other than Mn, the A element, Al, O, N, the D element, and the E element; and if the E element is two or more kinds of elements, the h represents the sum of the parameters of the respective elements.

$0.0003 \le a \le 0.09$, $0 \le b \le 0.24$, $0.25 \le c \le 0.41$, $0.35 \le d \le 0.56$, $0.02 \le e \le 0.13$, $0 \le f \le 0.10$, $0 \le g \le 0.20$, and $0 \le h \le 0.10$.

The phosphor of the present, invention satisfying the above composition condition can emit fluorescence having a peak at a wavelength in a range of 490 nm or longer and 550 nm or shorter, more specifically 515 nm or longer and 541 nm or shorter, upon irradiation of the excitation source. If the composition is further controlled, the phosphor of the present invention can emit fluorescence of green color with high color purity having a peak at a wavelength in a range of 518 nm or longer and 530 nm or shorter upon irradiation of the excitation source such that it can expand the color gamut of the light-emitting instrument and the image display device.

Here, the 'a' represents an additive amount of the metal ion Mn and satisfies $0.0003 \le a \le 0.09$. If the parameter 'a' value is less than 0.0003, the emission luminance may be lowered because the number of ions to serve as the center of emission is too low. If the parameter 'a' value is more than 0.09, the emission luminance may be lowered because of the concentration quenching caused by the interference among the ions. More preferably, the 'a' satisfies $0.005 \le a \le 0.025$, thereby allowing the emission brightness to be enhanced.

The b represents an amount of the A element, (monovalent metal element) and satisfies $0 \le b \le 0.24$. More preferably, the b satisfies $0.02 \le b \le 0.09$. If the b value is in this range, the emission intensity can be enhanced. The A element is Li, Na, K, or the like, but if it is Li, the emission intensity in particular could be enhanced.

The c represents an amount of Al element and satisfies $0.25 \le c \le 0.41$. More preferably, the c satisfies $0.31 \le c \le 0.41$. If the c value is out of this range, it might occur that a production ratio of crystal phases other than the AlON crystal, the AlON solid solution crystal, or the inorganic crystal having the identical crystal structure to that of the AlON crystal could be increased such that the emission intensity could be lowered.

The d represents an amount of oxygen and satisfies $0.35 \le d \le 0.56$. More preferably, the d satisfies $0.4 \le d \le 0.56$. If the d value is out of this range, it might occur that a production ratio of crystal phases other than the AlON crystal, the AlON solid solution crystal, or the inorganic crystal having the identical crystal structure to that of the AlON crystal could be increased such that she emission intensity could, be lowered.

The e represents an amount of nitrogen and satisfies $0.02 \le e \le 0.13$. More preferably, the e satisfies $0.02 \le e \le 0.075$. If the e value is out of this range, it might occur that a production ratio of crystal phases other than the AlON crystal, the AlON solid solution crystal, or the inorganic crystal having the identical crystal structure to that of the AlON crystal could be increased such that the emission intensity could be lowered.

The f represents an amount of the D element (divalent, metal element) and satisfies $0 \le f \le 0.1$. More preferably, the D element is Mg and the f satisfies $0.001 \le f \le 0.09$. If the f value is in this range, the emission intensity could be enhanced. The D element is preferably Mg and is very effective to enhance in particular the emission intensity.

The g represents an amount of the E element (monovalent anion element) and satisfies $0 \le g \le 0.20$. As the E element, fluorine, chlorine, bromine, and so on can be employed, but, in particular, F is preferable. If the E element is F, g satisfies $0.001 \le g \le 0.17$. If the g value is in this range, the emission intensity could be enhanced. As the E element, F is, in particular, effective to enhance in particular the emission intensity. As the E element, F is quite effective to enhance the emission intensity.

The h represents an amount of one or two or more kinds of elements (G element) other than Mn, the A element, Al, O, N, the D element, and the E element and satisfies $0 \le h \le 0.1$. The h value represents an amount of the G element which is contained in or solid solved into the AlON crystal, the AlON solid solution crystal, or the inorganic crystal having the identical crystal structure to that of the AlON crystal such that the amount of the G element contained in the mixture as crystal phases other than the above-described crystals or as an amorphous phase is not counted. As long as the crystal structure of the AlON crystal, the AlON solid solution crystal, or the inorganic crystal having the identical crystal structure to that of the AlON crystal is sustained, B, C, P, and so on could be included as the G element. And even if h=0, that is, the G element is not included, the emission intensity is high such that it could be greatly effective depending on the application thereof.

Here, the parameters a, b, c, d, e, f, and g preferably satisfies:

$0.0005 \le a \le 0.025$, $0 \le b \le 0.16$, $0.26 \le c \le 0.39$, $0.35 \le d \le 0.52$, $0.03 \le e \le 0.055$, $0 \le f \le 0.03$, and $0.01 \le g \le 0.18$.

In this way the phosphor of the present invention satisfying the above composition condition can reliably emit fluorescence having a peak at a wavelength in a range of 515 nm or longer and 541 nm or shorter upon irradiation of the excitation source.

Here, the parameters a, b, c, d, e, f, and g preferably satisfies:

$0.005 < a < 0.02$, $0.02 \le b \le 0.12$, $0.28 \le c \le 0.37$, $0.38 \le d \le 0.52$, $0.04 \le e \le 0.055$, $0.018 \le f \le 0.024$, and $0.02 \le g \le 0.15$.

In this way, the phosphor of the present invention satisfying the above composition condition can reliably emit fluorescence of green color with high color purity having a peak at a wavelength in a range of 518 nm or longer and 530 nm or shorter upon irradiation of the excitation source.

The phosphor of the present invention emits fluorescence of green color having a peak at a wavelength in a range of wavelength of 515 nm or longer and 541 nm or shorter upon irradiation of light, as the excitation source, having a wavelength of 410 nm or longer and 470 nm or shorter, preferably a wavelength of 420 nm or longer and 460 nm or shorter, more preferably a wavelength of 430 nm or longer and 460 nm or shorter. Further, in the above-described composition condition, if the 'a' satisfies $0.005 \le a \le 0.02$, fluorescence of green color having a peak at a wavelength in a range of wavelength of 518 nm or longer and 530 nm or shorter is emitted in a manner of emission of high intensity upon irradiation of light, as the excitation source, having a wavelength of 440 nm or longer and 460 nm or shorter, preferably a wavelength of 440 nm or longer and 450 nm and shorter.

As such an excitation source, an ultraviolet ray, an electron beam, an X-ray, and the like are preferable in view of emission efficiency. In the case where the excitation is caused by the ultraviolet ray and the visible light, it is efficiently excited in particular by the light having a wavelength of 420 nm or longer and 460 nm or shorter. Since the excitation efficiency by the light in particular having a wavelength of 430 nm or longer and 460 nm or shorter, preferably a wavelength of 440 nm or longer and 460 nm or shorter, and more preferably a wavelength of 440 nm or longer and 450 nm or shorter, it Is suitable for the application of the white or colored LED illumination, in which a light-emitting diode (LED) to emit light in such a range and the phosphor of the present invention are combined.

Furthermore, radiation of the excitation light having the peak at a wavelength in a range of 440 nm or longer and 460 nm or shorter, preferably a wavelength in a range of 440 nm or longer and 450 nm or shorter, causes fluorescence having a peak at a wavelength in a range of 518 nm or longer and 530 nm or shorter to be emitted. The fluorescence spectrum is a sharp spectrum having a narrow line width and exhibits a green color with high color purity such that the phosphor of the present invention is suitable for a green phosphor used for a backlight LED for the application to a liquid crystal image display element.

The phosphor of the present, invention efficiently emits the light especially by the electron beam such that it is suitable for the green phosphor for the application to the image display element of the electron beam, excitation such as the CRT and the FED.

In the phosphor of the present invention, in a view point, of the fluorescence emission, it is desirable that the inorganic compound includes, as the main component, the AlON crystal, the AlON solid solution crystal, or the inorganic crystal having the crystal structure identical to the AlON crystal, each of which includes at least Mn in high purity and as much as possible, and, if possible, it is desirable that the inorganic compound is constituted of a single phase thereof, but the inorganic compound may be a mixture with another crystal phase or an amorphous phase to the extent that the properties do not deteriorate. In this case, it is desirable that the content of the AlON crystal, the AlON solid, solution crystal, or the inorganic crystal having the crystal structure identical to the AlON crystal, each of which includes at least Mn, is 10 mass % or more, more preferably 50 mass % or more such that high brightness may be achieved.

Accordingly, in the phosphor of the present invention, the range of the main component of the inorganic compound is that the content of the AlON crystal, the AlON solid solution crystal, or the inorganic crystal, having the crystal structure identical to the AlON crystal, each of which includes at least Mn, is at least 10 mass % or more. The ratio of the content can be obtained by performing an X-ray diffraction measurement and conducting a Rietveld analysis on both the crystal phase of the AlON crystal, the AlON solid solution crystal, or the inorganic crystal having the crystal structure identical to the AlON crystal and other crystal phases than the above-mentioned crystal phase. In a simplified way, the ratio of the content can be obtained from a ratio of intensities of the highest peaks of the respective phases of the crystal phase of the AlON crystal, the AlON solid solution crystal, or the inorganic crystal having the crystal structure identical to the AlON crystal and the other crystal phases.

The other crystal phase or the amorphous phase may comprise inorganic substance having electric conductivity. In the VFD or FED, if the phosphor of the present invention is exerted by the electron beam, it is preferable that the phosphor has the electric conductivity to some extent since electrons are not accumulated on the phosphor, but tire released outside. The inorganic substance having the electrical conductivity could be an oxide, an oxynitride, a nitride, or a combination thereof, which includes one or two or more kinds of elements selected from Zn, Ga, In, and Sn. In particular, indium oxide and indium tin oxide (ITO) are preferable since the fluorescence intensity is hardly lowered and the electric conductivity is high.

While the phosphor of the present invention emits green light, if it is necessary to mix the green light with other color light such as yellow light and red light, another inorganic phosphor which emits the other color light may be mixed with the phosphor of the present invention. While the other inorganic phosphor includes an inorganic phosphor that has a host crystal constituted of a fluoride, an oxide, an oxyfluoride, a sulfide, an oxysulfide, an oxynitride, or a nitride crystal, etc., if the thus-mixed phosphor is required to have durability, the inorganic phosphor may include the oxynitride crystal or the nitride crystal as the host crystal.

The phosphor including, as the host crystal, the oxynitride and the nitride crystal may comprise a yellow phosphor of an α-sialon: Eu, a blue phosphor of an α-sialon: Ce, a red phosphor of $CaAlSiN_3$: Eu and (Ca, Sr) $AlSiN_3$: Su (phosphor in which Ca of a $CaAlSiN_3$ crystal is partially substituted by Sr), a blue phosphor $((LaAl (Si_{6-z}Al_z) N_{10-z}O_z)$: Ce) having a JEM phase as a host, a blue phosphor of $La_3Si_8N_{11}O_4$: Ce, a blue phosphor of AlN: Eu, and so on.

As the backlight LED for the image display device, a red phosphor emitting light, having a peak at a wavelength in a range of 620 nm or longer and 670 nm or shorter may be added, in addition to the phosphor of the present invention.

As such a phosphor, a $Mn^{4+}$ activated phosphor may be utilized. The $Mn^{4+}$ activated phosphor is, preferably, $K_2SiF_6$: Mn (KSF), KSNAF ($K_2Si_{1-x}Na_xAl_xF_6$: Mn) where constituent elements of KSF are partially (preferably, 10 mole % or less) substituted by Al and Na, $K_2TiF_6$: Mn (KTF), and so on.

Phosphors of the present invention have different excitation spectra and different fluorescence spectra, respectively, depending on compositions thereof, and it is possible to design phosphors having various emission spectra by selecting and combining them as appropriate. A phosphor having a necessary emission spectrum may be designed on the basis of the application.

A preferred manufacturing method according to the present invention will be explained as follows.

A method of manufacturing a phosphor of the present, invention includes: mixing an AlON-containing raw material selected from a group consisting of the AlON crystal, the AlON solid solution crystal, or the inorganic crystal having the crystal structure identical to that of the AlON crystal; a raw material including Mn; and, if necessary, a raw material including Li, and heat-treating a mixture thereof in a nitrogen atmosphere of 0.2 atm or higher and 100 atm or lower at a temperature of 1500° C. or higher and 1900° C. or lower. In this way, the content of Mn in the AlON-containing raw material can be increased, Here, the AlON-containing raw material may be the AlON crystal, the AlON solid solution crystal, or the inorganic crystal having the crystal structure identical to that of the AlON crystal and, if necessary, further include the A element, the D element, she S element, the G element, and Mn.

Here, a method of synthesizing the AlON-containing raw material will be described in detail.

A raw material including Al, a raw material including the A element (where the A element is a monovalent metal element) if necessary, a raw material including the D element (where the D element is a divalent metal element) if necessary, and a raw material including Mn if necessary, are prepared. For example, the A element is Li and the D element is Mg.

The raw material including Al is selected from a group consisting of aluminum metal, an aluminum oxide, an aluminum nitride, and an organic precursor containing aluminum, but it is preferred to use a mixture of an aluminum nitride and an aluminum oxide. These materials have high reactivity and can be obtained as a synthesized compound of high purity, and further have the advantage that they are readily available because the materials are produced as industrial raw materials. The amounts of the aluminum nitride and the aluminum oxide may be calculated and designed based on the ratio of oxygen and nitrogen of the target AlON composition.

The raw material including the D element is selected from a group consisting of a metal of the D element, an oxide of the D element, a carbonate of the D element, a nitride of the D element, a fluoride of the D element, a chloride of the D element, an oxynitride of the D element, and a combination of the above-mentioned substances. In the case where the D element is Mg, the raw material including the D element may be added thereto as a metal including magnesium, an oxide of magnesium, a carbonate of magnesium, a nitride of magnesium, a fluoride of magnesium, a chloride of magnesium, an oxynitride of magnesium, and a combination of above-mentioned, substances, but it is preferred to add magnesium oxide and magnesium carbonate. These materials have high reactivity and can be obtained as a synthesized compound of high purity, and further have the advantage that they are readily available because the materials are produced as industrial raw materials.

The raw material including the A element is a nitride of the A element, a carbonate of the A element, a fluoride of the A element, and so on. In particular, in they case where the A element is lithium, the raw material including the A element is selected from a group consisting of lithium nitride, lithium carbonate, and lithium fluoride.

The raw material including Mn is a metal of Mn, an oxide of Mn, a carbonate of Mn, a nitride of Mn, a fluoride of Mn, a chloride of Mn, an oxynitride of Mn, and a combination of the above-mentioned substances. Preferably, the raw material including Mn is manganese monoxide, manganese dioxide, and manganese carbonate. These materials have high reactivity and can be obtained as a synthesized compound of high purity, and further have the advantage that they are readily available because the materials are produced as industrial raw materials.

A raw material mixture prepared by mixing these raw materials is filled in a container in a state where a filling rate thereof is maintained to a relative bulk density of 40% or less. The mixture is then fired in a nitrogen atmosphere of 0.2 atm or higher and 100 atm or lower in a temperature range of 1600° C. or higher and 2400° C. or lower. The firing temperature is preferably 1800° C. or higher and 2400° C. or lower, and more preferably 1900° C. or higher and 2200° C. or lower. In this way, an AlON-containing raw material comprising the AlON, the AlON solid solution into which Kg, Li, Mn, Eu and so on are solid solved, or the inorganic crystal having the crystal structure identical to that of the AlON crystal may be manufactured.

The optimum firing temperature may vary according to the composition, so that it can be optimized for each composition as appropriate. If the firing temperature is lower than 1600° C., a generation rate of the AlON crystal, the AlON solid solution crystal, or the inorganic crystal having the crystal structure identical to that of the AlON crystal may be too low. If the firing temperature exceeds 2400° C., a special device is required, which is industrially undesirable.

In order to improve reactivity during the firing process, an inorganic compound which forms a liquid phase at the firing temperature or a temperature below the firing temperature may be added to the raw material mixture if necessary. An inorganic compound which forms a stable liquid phase at a reaction temperature is preferable for the inorganic compound and a fluoride, a chloride, an iodide, a bromide, or a phosphate of Li, Na, K, Mg, Ca, Sr, Ba, or Al is suitable. Furthermore, not only the inorganic compound of one kind may be added by itself, bus also two or more kinds of inorganic compounds may be mixed and added. In particular, magnesium fluoride, aluminum fluoride, and lithium fluoride are preferable because they improve reactivity for synthesis. Although the additive amount of the inorganic compound is not specifically limited, a range of 0.1 weight parts or more and 10 weight parts or less to 100 weight parts of the raw material mixture is preferable for improving the reactivity. The additive amount less than 0.1 weight parts may not provide so much improvement of the reactivity, and the additive amount exceeding 10 weight parts may cause the brightness of the phosphor to be lowered. If these inorganic, compounds are added to the raw material mixture and then the mixture is fired, the reactivity of the mixture is improved such that a particle growth may be promoted in a relatively short time so as to yield a single crystal having a large particle diameter such that the brightness of the phosphor is improved.

The nitrogen atmosphere may be a gas atmosphere in a pressure range of 0.2 atm or higher and 100 atm or lower. If it is heated at temperature of 2400° C. or higher in a nitrogen gas atmosphere less than 0.2 atm, the raw material tends to be subject to pyrolysis, which is not so much preferable. If it exceeds 100 atm, special equipment is required such that it is not industrially suitable.

When fine powder of a particle diameter of several micrometers is employed as a starting material, the mixture of raw material after completion of the mixing process exhibits morphology in which the fine powder of the particle diameter of several micrometers aggregates to a size of several hundreds of micrometers to several millimeters (hereinafter called "powder aggregate"). In the present invention, the powder aggregate is fired in a state with the filling rate maintained in a bulk density that does not exceed 40%. Further, it is preferable that the bulk density does not exceed 20%. Here, the term of relative bulk density means the ratio of a value (bulk density) given by dividing the mass of powder material filled in the container by the capacity of the container to a value of the real density of the substance of the powder material. In a typical sialon production, a hot pressing method in which heating is conducted as it is pressurized or a manufacturing method of firing after die molding (powder compacting) is employed, and hence the firing process is conducted in a state where the powder filling rate is high. In the present invention, however, the powder aggregate of the raw material mixture in which the particle size is made rather uniform is charged into a container or the like as it is with a filling rate of a bulk density that does not exceed 40% without applying any mechanical force to the powder or without molding the powder with a die in advance. If necessary, the powder aggregate may be subject to particle size control by granulating it to an average particle diameter that does not exceed 500 µm by using a sieve or an air classifier. Also, the powder aggregate may be granulated directly into a shape size of an averaged particle diameter of 500 µm or smaller by using a spray dryer and the like. A container of boron nitride has an advantage of little reactivity with the phosphor.

The reason why the firing process is performed while the bulk density is maintained not to exceed 40% is to fire the raw material powder while a free space is maintained around the raw material powder. The optimal bulk density depends on the shapes and surface conditions of the granulated particles, but it is typically preferable for it not to exceed 20%. In this way, crystals of reaction products grow in a free space, so that it is likely that the crystals have smaller chance to come into contact with each other, whereby crystals with a smaller number of surface defects are considered to be synthesized. Therefore, a high-brightness phosphor may be obtained. When the bulk density exceeds 40%, partial densification takes place during the firing so that a dense sintered body appears, which hinders crystal growth. As a result, the brightness of the phosphor may be reduced. And powder products with fine particles are unlikely to be obtained. The powder aggregate having an average particle size of 500 µm or smaller is particularly preferable to achieve excellent grindability after the firing.

Then, the powder aggregate having a filling rate of 40% or smaller is fired under the above condition. The furnace used for firing may be heated by metal resistance heating or graphite resistance heating because the firing temperature is high and nitrogen is employed as the firing atmosphere. An electric furnace in which carbon is used for the material in a hot section of the furnace is preferable. As for firing, a sintering method in which no mechanical pressure is applied from the outside, such as normal pressure sintering and gas pressure sintering, is desirable for performing firing while maintaining the bulk density in a predetermined range.

When the powder aggregate obtained by firing is solidified hard, the aggregate is around by using a mill usually employed in the factory, such as a ball mill, jet mill, and the like. Among them, the particle sire is controlled most easily in ball milling. At this time, balls and a pot to be used are preferably made of sintered silicon nitride, sintered sialon, or the like. Grinding is continued until an averaged particle diameter of 20 µm or smaller is reached. A particularly desirable averaged particle diameter is 5 µm or larger and 20 µm or smaller. When the averaged particle diameter exceeds 20 µm, the fluidity of the powder and dispersion into resin deteriorate, and the emission intensity may become nonuniform from part to part when a light emitting device is built by combining the phosphor with a light-emitting element. When the averaged particle diameter does not exceed 5 µm, the emission efficiency of the phosphor may be lowered. If an objective particle diameter is not achieved by grinding alone, classification may be used in combination with the grinding. Sieving, air classification, and settling in a liquid may be employed as means of classification.

Further, by washing the fired product with a solvent for dissolving these inorganic compounds after the firing, the contents of the inorganic compounds such as glass phases, a second phase, or impurity phases other than the phosphor contained in the reaction product is reduced so that the brightness of the phosphor is improved. As such a solvent, water and aqueous solution of an acid can be used. As the aqueous solution of the acid, sulfuric acid, hydrochloric acid, nitric acid, hydrofluoric acid, a mixture of organic acid and hydrofluoric acid, or the like can be used. In particular, the mixture of sulfuric acid and hydrofluoric acid has a great effect. This processing is quite effective with respect to a reaction product fired at a high temperature wherein the inorganic compounds yielding a liquid phase at the firing temperature or lower have been added to the raw material mixture in advance.

In the way described above, the powder of the raw material including AlON is obtained and, according to the present invention, a raw material including Mn and, if necessary, a raw material including Li are added to the raw material including AlON and the thus-mixed materials are heat-treated in a nitrogen atmosphere of 0.2 atm or higher and 100 atm or lower at a temperature range of 1500° C. or higher and 1900° C. or lower. In this way, it is effectively caused that Mn is stably solid, solved into the AlON crystal, the AlON solid solution crystal, or the inorganic crystal having the crystal structure identical to that of the AlON crystal and that the content of Mn included in these crystals is increased. As a result, the emission intensity is improved. The degree of non-uniformity of emission characteristics between production lots may be reduced and a yield ratio thereof may be improved. Here, there are no limits, in particular, in the heat treatment time, but typically, it is in a range of 0.5 hours or more and 24 hours or less. If the heat treatment time is less than 0.5 hours, there may be a product in which Mn is not sufficiently solid solved. If the heat treatment, time exceeds 24 hours, there may be a case in which, solid, solution of Mn does not occur effectively.

The raw material including AlON, of course, may include the A element, the D element, the E element, and the G element in addition to Mn since it is manufactured by the above-described manufacturing method of the raw material including AlON. For example, the raw material including AlON is the AlON solid solution crystal and the AlON solid solution crystal includes one or two or more kinds of elements selected from a group consisting of Mn, Eu, Mg, and Li such that the content of Mn may be increased in a similar way.

Synthesis of the AlON crystal, the AlON solid solution crystal, or the inorganic crystal having the crystal structure identical to that of the AlON crystal is performed at a high temperature of 1800° C. or higher, or more preferably of 1900° C. or higher from a view point of the reaction rate. In order to increase the particle diameter, it is preferable that the high temperature is 2000° C. or higher. On the other hand, since the vaper pressure of Mn is high, a long time heat treatment at a high temperature of at least 1800° C. may cause the content of Mn in the AlON crystal, the AlON solid solution crystal, or the inorganic crystal having the crystal structure identical to that of the AlON crystal to be reduced. If the content of Mn is reduced, the brightness of the phosphor is lowered and the degree of non-uniformity of emission characteristics between lots is increased.

In the present invention, it is characterized in that, as mentioned above, after the AlON crystal, the AlON solid solution crystal, or the inorganic crystal having the crystal structure identical to that of the AlON crystal is synthesized at a high temperature, the raw material including Mn is added to the synthesized crystal, and that the heat treatment is performed at a temperature lower than the synthesis temperature of the AlON crystal, the AlON solid solution crystal, or the inorganic crystal having the crystal structure identical to that of the AlON crystal. In this way, it is possible to improve the crystallinity and the particle diameter of the AlON crystal, the AlON solid solution crystal, or the inorganic crystal having the crystal structure identical to that of the AlON crystal, and further to add an amount of Mn, which is necessary for the emission characteristics, to the AlON crystal, the AlON solid solution crystal, or the inorganic crystal having the crystal structure identical to that of the AlON crystal. That is, according to a method of the present invention, in comparison to an AlON phosphor obtained by the conventional synthesis method, an AlON phosphor having the content of Mn, which is necessary for the emission, and exhibiting high brightness may be synthesized.

For the raw material including Mn, it is possible to employ the raw material including Mn which is used in manufacturing the above-described raw material including AlON, but it may be selected from a group consisting of manganese fluoride, manganese chloride, manganese silicide, manganese phosphide, and manganese sulfide from a viewpoint of reactivity.

For the raw material including Li, a raw material including the A element (in the case where the A element is Li) used in the above-described manufacture of the raw material including AlON can be employed, but it may be lithium fluoride and/or lithium nitride from a viewpoint of reactivity.

Further, it is preferable that a heat treatment under the predetermined condition that a raw material including Mn and, if necessary, a raw material including Li are added to the raw material including AlON is performed until the content of Mn in the raw material including AlON is at least 0.5 atomic %. In this way, a phosphor exhibiting improved emission brightness can be obtained.

A more preferable manufacturing method of a phosphor of the present invention will be shown.

Firstly, the raw material including AlON is mixed with aluminum oxide and aluminum nitride as the raw material including Al, a raw material including the D element if necessary, and a raw material including the A element if necessary. Here, it is possible to mix the raw material including AlON with the raw material including Al and the raw material including the D element (not including the A element), or with the raw material including Al and the raw material including the A element (not including the D element). The thus-mixed raw material is fired in a nitrogen atmosphere in a range of 0.2 atm or higher and 100 atm or lower at a temperature range of 1800° C. or higher and 2400° C. or lower, preferably of 1900° C. or higher and 2200° C. or lower. In this way, the raw material including AlON Is synthesized. Here, the D element and the A element may be Mg and Li, respectively. If it is fired in a temperature range of 1900° or higher and 2200° C. or lower, an AlON crystal of high crystal Unity, an AlON solid solution crystal of high crystallinity, or the inorganic crystal of high crystallinity having the crystal structure identical to that of the AlON crystal is obtained.

The thus-synthesized raw material including AlON is mixed with manganese fluoride as the raw material including Mn and, if necessary, lithium fluoride as the raw material including the A element, and a heat treatment is performed in a temperature range of 1500° C. or higher and 1850° C. or lower. If it is out of the temperature range of 1500° C. or higher and 1850° C. or lower, there may a case where Mn is not sufficiently solid solved into the AlON crystal, the AlON solid solution crystal, or the inorganic crystal having the crystal structure identical to that of the AlON crystal.

Further, by washing the fired product with a solvent for dissolving these inorganic compounds after the firing, the contents of the inorganic compounds such as glass phases, a second phase, or impurity phases other than the phosphor contained in the reaction product is reduced so that the brightness of the phosphor is improved. As a such solvent, water and aqueous solution of an acid can be used. As the aqueous solution of the acid, sulfuric acid, hydrochloric acid, nitric acid, hydrofluoric acid, a mixture of organic acid and hydrofluoric acid, or the like can be used. In particular, the mixture of sulfuric acid and hydrofluoric acid has a great effect. This processing is quite effective with respect to a reaction product fired at a high temperature wherein the inorganic compounds yielding a liquid phase at the firing temperature or lower have been added to the raw material mixture in advance.

In the way described above, fine phosphor powder is obtained, but the heat treatment is effective in order to further improve the brightness. In this case, the powder after firing or the powder after particle size adjustment by pulverization and classification may only have to be subject to heat treatment at a temperature that is 1000° C. or higher and is equal to or lower than the firing temperature. The heat treatment at a temperature lower than 1000° C. is not so much effective in removing surface defects. The heat treatment at a temperature equal to or higher than the firing temperature is not preferable because pulverized powders aggregate again with each other. The atmosphere suitable for the heat treatment depends on the phosphor composition, but a mixture atmosphere of one or two or more kinds of gases selected from a group consisting of nitrogen, air, ammonia, and hydrogen can be used and a nitrogen atmosphere is preferable because it is excellent in removing defects.

The phosphor of the present invention obtained in the way as described above is characterized by high brightness of a visible light emission as compared with an ordinary oxide phosphor and an existing AlON phosphor. In particular, a phosphor having a specific composition is characterized by green light emission and is suitable for a light-emitting instrument and an image display device. In addition, the phosphor of the present invention does not deteriorate even if it is exposed to a high temperature such that it is excellent in the heat resistance and the long-term stability under an oxidizing atmosphere and a moisture environment.

As mentioned above, the light-emitting instrument of the present invention includes at least an emission source that emits light having a wavelength of 410 nm or longer and 460 nm or shorter, and the above-described phosphor or a light transmitting body in which the phosphor is dispersed.

As the light-emitting instrument, an LED illuminating device, an LD (laser diode) illuminating device, and the like are included. The LED illuminating device may be manufactured, using the phosphor of the present invention, by a known method disclosed in Japanese Unexamined Patent Application Publication No. H05(1993)-152609, Japanese Unexamined Patent Application Publication No. H07 (1995)-99345, Japanese Patent No. 2927279, for example. In this case, it is desirable that the emission source is what emits light having the wavelength of 410 nm or longer and 470 nm or shorter, and in particular it is preferably an LED light emitting element or an LD light emitting element that emits light having a peak at a wavelength in a range of 430 nm or longer and 470 nm or shorter. The emission source is an LED light emitting element or an LD light emitting element that emits light having a peak at a wavelength in a range preferably of 420 nm or longer and 460 nm or shorter, further of 430 nm or longer and 460 nm or shorter, further 440 nm or longer and 460 nm or shorter, and further 440 nm or longer and 450 nm or shorter. If the emission source characterized by such a wavelength is used, the phosphor of the present invention can perform the emission of high intensity. Here, as such a light-emitting element, an element comprising a nitride semiconductor such as GaN and InGaN is included and could be an emission source to emit light having a predetermined wavelength by adjusting a composition thereof.

A light-emitting instrument which emits light of a desired color can be configured by using another phosphor having other emission characteristics in combination with the phosphor of the present invention other than by using only the phosphor of the present invention alone in the light-emitting instrument. As an example thereof, there is a combination of a blue LED or LD light-emitting element of 445 nm, a yellow phosphor excited by the light of the wavelength and then exhibiting an emission peak at a wavelength of 550 nm or longer and 600 nm or shorter, and a green phosphor of the present invention. As such a yellow phosphor, an α-sialon: $Eu^{2+}$ disclosed in Japanese Unexamined Patent Application Publication No, 2002-363554 and $(Y, Gd)(Al, Ga)_5O_{12}$: Ce disclosed in Japanese Unexamined Patent Application Publication. No. H09 (1997)-218149 may be referred to. In such a configuration, irradiating the blue light emitted by the LED or the LD on the phosphors causes the phosphors to emit green light and yellow light, respectively, and mixing the blue light and the light from the phosphors causes the light-emitting instrument to emit light of white color.

As another example, there is a combination of a blue LED or LD light emitting element of light of 445 nm, a red phosphor-being excited by the light of the wavelength and emitting light having an emission peak at a wavelength of 620 nm or longer and 670 nm or shorter, and a green phosphor of the present invention. Such a red phosphor includes $CaSiAlN_3$: $Eu^{2+}$ disclosed in International Publication No. 2005/052087 and KSF or KSNAF. In such a configuration, irradiating the blue light, emitted by the LSD or the LD on the phosphors causes the phosphors to emit red light and green light, respectively, and mixing the blue light and the light from the phosphors causes the light-emitting instrument to emit light of white color.

The light transmitting body in which the phosphor including at least the phosphor of the present invention is dispersed is selected from a group consisting of acrylic resin, silicone resin, and glass. These materials have excellent translucency to the above-described light from the emission source, thereby allowing the phosphor of the present invention to be excited quite efficiently.

And a proportion of the phosphor in the light transmitting body in which the phosphor including at lease the phosphor of the present invention is dispersed is preferably in a range of 30 volume % or more and 90 volume % or less. In this way, the phosphor of the present invention can be allowed to be excited quite efficiently.

In the image display device of the present invention, the above-described light-emitting instrument is used as a backlight. Such an image display device is, for example, a liquid crystal display (LCD) of a liquid crystal television, a mobile terminal, and the like. In the above-described light-emitting instrument, the above-described phosphor is employed as a constituent for emitting green light having a sharp spectrum such that the color space (color gamut) which is reproducible by the liquid crystal display becomes wider such that a liquid crystal panel having high color reproducibility may be provided.

Another image display device of the present invention includes at least an excitation source and a phosphor, and here, the phosphor includes at least the above-described phosphor of the present invention. The image display device includes a fluorescent display tube (VFD), a field emission display (FED or SED), a plasma display panel (PDP), a cathode-ray tube (CRT), and so on. It has been confirmed that the phosphor of the present invention emits light by excitation of a vacuum ultraviolet ray of 100 to 190 nm, an ultraviolet ray of 190 to 380 nm, an electron beam, or the like, and the above-described image display devices can be configured by combining these excitation sources and the phosphor of the present invention.

Since the phosphor of the present application is efficiently excited and excellent in the excitation by the electron beam, it is suitable for the application to VFD, SED, PDP, and CRT, in which the acceleration voltage of the electron beam is 10 V or higher and 30 kV or lower. The FED is an image display device in which luminescence is produced by bombarding the phosphor applied on the anode with electrons emitted and accelerated from the field emission cathode and it is required that the luminescence be made with an acceleration voltage not exceeding 5 kV so that the display device will be improved in the luminescence performance by combining the phosphor of the present invention.

Then, the present invention will be explained in more detail with examples to be shown below, but these examples are disclosed only to facilitate the understanding of the present invention with ease and it should be understood that the present invention is not limited to these examples.

EXAMPLES

Examples 1 to 28

As raw material powders, aluminum nitride powder (manufactured by Tokuyama Corporation, F grade) with a specific surface area of 3.3 m²/g and an oxygen content of 0.79%, aluminum oxide powder (manufactured by TAIMEI CHEMICALS CO., LTD., Taimicron grade) with a specific surface area of 13.6 m²/g and a purity of 99.99%, lithium carbonate powder (manufactured by Kojundo Chemical Lab. Co., reagent grade), $LiAiO_2$ powder, lithium fluoride (manufactured by Kojundo Chemical Lab, Co., reagent grade) with a purity of 99.9%, manganese fluoride powder (manufactured by Kojundo Chemical Lab. Co., reagent grade) with a purity of 99.9%, and magnesium oxide (manufactured by Kojundo Chemical Lab. Co., reagent grade; with a purity of 99.99% were used.

Synthesis of Raw Material Including AlON

First, a raw material powder including AlON was synthesized. In order to make design compositions as shown in Table 1, aluminum oxide, aluminum nitride, magnesium oxide if necessary, lithium carbonate, and $LiAlO_2$ were weighed. For example, in the case of Example 1, aluminum oxide, aluminum nitride, and magnesium oxide were weighed as much as 83.85 mass %, 11.24 mass %, and 4.91 mass %, respectively. After the raw material was mixed using a mortar and a pestle made of silicon nitride sintered body, the mixed raw material was passed through a sieve having openings of 125 μm such that a resultant powder aggregate having an excellent fluidity was obtained. Free-falling the powder aggregate into a crucible made of boron nitride having a size of 20 mm in the diameter and 20 mm in the height caused the bulk density of 30 volume %. The bulk density was calculated from the weight of the powder aggregate fallen into the crucible, an inner volume of the crucible, and a true density of the powder.

Next, the crucible was set into an electric furnace of a graphite resistive heating type. In the firing operation, first, a diffusion pump was used to make a firing atmosphere vacuum, heating was performed from a room temperature to 800° C. at a speed of 600° C. per hour, nitrogen having the purity of 99.9995 volume % was introduced at 800° C. to make a gas pressure 4.5 atm, the temperature was raised to a temperature as shown in Table 1 (for example, 2000° C. for Example 1) at 600° C. per hour, and then, it was kept at the temperature for a period of time as shown in Table 1 (for example, two hours for Example 1). The synthesized sample was milled using the mortar and the pestle made of silicon nitride and thus-milled sample was passed through a sieve having openings of 125 μm. With the thus-obtained powder, the powder X-ray diffraction measurement (XRD) using Cu Kα line was carried out such that it was confirmed that a crystal having a γ-type AlON structure had been produced. From ratios of main peaks, it was determined that a production ratio of the crystal having the γ-type AlON structure was at least 90%. The thus-obtained powder was made to be a raw material powder including AlON.

Synthesis of Phosphor

In order to prepare design compositions as shown in Table 2, the synthesized raw material powder including AlON, $MnF_2$ powder, and LiF powder were weighed. For example, in the case of Example 1, the raw material powder including AlON, the $MnF_2$ powder, and the LiF powder were weighed for 2 g, 0.16 g, and 0.2 g, respectively, as the mass ratios were satisfied. After the raw material was mixed using a mortar and a pestle made of silicon nitride sintered body, the mixed raw material was passed through a sieve having openings of 125 μm and then was made to free-fall into a crucible made of boron nitride having a size of 20 mm in the diameter and 20 mm in the height.

Next, the crucible was set into an electric furnace of a graphite resistive heating type. In the firing operation, first, a diffusion pump was used to make a firing atmosphere vacuum, heating was performed from a room temperature to 800° C. at a speed of 600° C. per hour, nitrogen gas having the purity of 99.9995 volume % was introduced at 800° C. to make a gas pressure 4.5 atm, the temperature was raised to a temperature as shown in Table 2 (for example, 1700° C. for Example 1) at 600° C. per hour, and then, it was kept at the temperature for a period of time as shown in Table 2 (for example, two hours for Example 1). The synthesized sample was milled using the mortar and the pestle made of silicon nitride.

TABLE 1

List of design composition parameters, raw material mixture ratio (mass %) and Firing conditions, in examples 1 to 28

| Example | Design composition parameter | | | | | | | Raw material mixture (mass %) | | | | | Temperature (° C.) | Time (time) |
| --- | --- | --- | --- | --- | --- | --- | --- | --- | --- | --- | --- | --- | --- | --- |
| | a | b | c | d | e | f | g | AlN | Al2CO3 | Li2CO3 | LiAlO2 | MgO | | |
| 1 | 0.000 | 0.000 | 0.391 | 0.528 | 0.056 | 0.025 | 0.000 | 11.24 | 83.85 | | | 4.91 | 2000 | 2 |
| 2 | 0.000 | 0.026 | 0.417 | 0.497 | 0.060 | 0.000 | 0.000 | 11.83 | 81.76 | | 6.41 | | 1900 | 4 |
| 3 | 0.000 | 0.025 | 0.396 | 0.522 | 0.057 | 0.000 | 0.000 | 11.28 | 84.2 | 4.52 | | | 2050 | 1 |
| 4 | 0.000 | 0.025 | 0.396 | 0.497 | 0.057 | 0.025 | 0.000 | 11.25 | 77.74 | | 6.09 | 4.92 | 1950 | 2 |
| 5 | 0.000 | 0.000 | 0.391 | 0.528 | 0.056 | 0.025 | 0.000 | 11.24 | 83.85 | | | 4.91 | 2100 | 0.5 |
| 6 | 0.000 | 0.000 | 0.391 | 0.528 | 0.056 | 0.025 | 0.000 | 11.24 | 83.85 | | | 4.91 | 2000 | 2 |
| 7 | 0.000 | 0.000 | 0.391 | 0.528 | 0.056 | 0.025 | 0.000 | 11.24 | 83.85 | | | 4.91 | 2000 | 2 |
| 8 | 0.000 | 0.000 | 0.391 | 0.528 | 0.056 | 0.025 | 0.000 | 11.24 | 83.85 | | | 4.91 | 2000 | 2 |
| 9 | 0.000 | 0.000 | 0.391 | 0.528 | 0.056 | 0.025 | 0.000 | 11.24 | 83.85 | | | 4.91 | 2000 | 2 |
| 10 | 0.000 | 0.000 | 0.391 | 0.528 | 0.056 | 0.025 | 0.000 | 11.24 | 83.85 | | | 4.91 | 2000 | 2 |
| 11 | 0.000 | 0.000 | 0.391 | 0.528 | 0.056 | 0.025 | 0.000 | 11.24 | 83.85 | | | 4.91 | 2000 | 2 |
| 12 | 0.000 | 0.000 | 0.391 | 0.528 | 0.056 | 0.025 | 0.000 | 11.24 | 83.85 | | | 4.91 | 2000 | 2 |
| 13 | 0.000 | 0.000 | 0.391 | 0.528 | 0.056 | 0.025 | 0.000 | 11.24 | 83.85 | | | 4.91 | 2000 | 2 |
| 14 | 0.000 | 0.000 | 0.391 | 0.528 | 0.056 | 0.025 | 0.000 | 11.24 | 83.85 | | | 4.91 | 2000 | 2 |
| 15 | 0.000 | 0.000 | 0.391 | 0.528 | 0.056 | 0.025 | 0.000 | 11.24 | 83.85 | | | 4.91 | 2000 | 2 |
| 16 | 0.000 | 0.000 | 0.391 | 0.528 | 0.056 | 0.025 | 0.000 | 11.24 | 83.85 | | | 4.91 | 2000 | 2 |
| 17 | 0.000 | 0.000 | 0.391 | 0.528 | 0.056 | 0.025 | 0.000 | 11.24 | 83.85 | | | 4.91 | 2000 | 2 |
| 18 | 0.000 | 0.000 | 0.391 | 0.528 | 0.056 | 0.025 | 0.000 | 11.24 | 83.85 | | | 4.91 | 2000 | 2 |
| 19 | 0.000 | 0.000 | 0.391 | 0.528 | 0.056 | 0.025 | 0.000 | 11.24 | 83.85 | | | 4.91 | 2000 | 2 |
| 20 | 0.000 | 0.000 | 0.391 | 0.528 | 0.056 | 0.025 | 0.000 | 11.24 | 83.85 | | | 4.91 | 2000 | 2 |
| 21 | 0.000 | 0.000 | 0.391 | 0.528 | 0.056 | 0.025 | 0.000 | 11.24 | 83.85 | | | 4.91 | 2000 | 2 |
| 22 | 0.000 | 0.000 | 0.391 | 0.528 | 0.056 | 0.025 | 0.000 | 11.24 | 83.85 | | | 4.91 | 2000 | 2 |
| 23 | 0.000 | 0.000 | 0.391 | 0.528 | 0.056 | 0.025 | 0.000 | 11.24 | 83.85 | | | 4.91 | 2000 | 2 |
| 24 | 0.000 | 0.000 | 0.391 | 0.528 | 0.056 | 0.025 | 0.000 | 11.24 | 83.85 | | | 4.91 | 2000 | 2 |
| 25 | 0.000 | 0.000 | 0.391 | 0.528 | 0.056 | 0.025 | 0.000 | 11.24 | 83.85 | | | 4.91 | 2000 | 2 |
| 26 | 0.000 | 0.000 | 0.391 | 0.528 | 0.056 | 0.025 | 0.000 | 11.24 | 83.85 | | | 4.91 | 2000 | 2 |
| 27 | 0.000 | 0.000 | 0.391 | 0.528 | 0.056 | 0.025 | 0.000 | 11.24 | 83.85 | | | 4.91 | 2000 | 2 |
| 28 | 0.000 | 0.000 | 0.391 | 0.528 | 0.056 | 0.025 | 0.000 | 11.24 | 83.85 | | | 4.91 | 2000 | 2 |

TABLE 2

List of design composition parameters, raw material mixture ratio (mass ratio) and Firing conditions, in examples 1 to 28

| Example | Design composition parameter | | | | | | | Raw material mixture (mass ratio) | | | Temperature (° C.) | Time (time) |
| --- | --- | --- | --- | --- | --- | --- | --- | --- | --- | --- | --- | --- |
| | a | b | c | d | e | f | g | AlON powder | MnF2 | LiF | | |
| 1 | 0.015 | 0.065 | 0.323 | 0.436 | 0.046 | 0.021 | 0.094 | 2 | 0.16 | 0.2 | 1700 | 2 |
| 2 | 0.014 | 0.086 | 0.345 | 0.411 | 0.049 | 0.000 | 0.093 | 2 | 0.16 | 0.2 | 1600 | 4 |
| 3 | 0.014 | 0.085 | 0.329 | 0.433 | 0.047 | 0.000 | 0.093 | 2 | 0.16 | 0.2 | 1750 | 1 |
| 4 | 0.014 | 0.085 | 0.328 | 0.411 | 0.047 | 0.021 | 0.093 | 2 | 0.16 | 0.2 | 1800 | 2 |
| 5 | 0.005 | 0 | 0.385 | 0.519 | 0.055 | 0.024 | 0.011 | 2 | 0.05 | 0 | 1700 | 2 |
| 6 | 0.011 | 0 | 0.379 | 0.511 | 0.054 | 0.024 | 0.021 | 2 | 0.1 | 0 | 1700 | 2 |
| 7 | 0.016 | 0 | 0.373 | 0.503 | 0.053 | 0.024 | 0.031 | 2 | 0.15 | 0 | 1700 | 2 |
| 8 | 0.021 | 0 | 0.367 | 0.495 | 0.052 | 0.023 | 0.041 | 2 | 0.2 | 0 | 1700 | 2 |
| 9 | 0.005 | 0.022 | 0.368 | 0.496 | 0.053 | 0.023 | 0.032 | 2 | 0.05 | 0.06 | 1700 | 2 |
| 10 | 0.010 | 0.022 | 0.362 | 0.489 | 0.052 | 0.023 | 0.042 | 2 | 0.1 | 0.06 | 1700 | 2 |
| 11 | 0.015 | 0.022 | 0.357 | 0.481 | 0.051 | 0.023 | 0.052 | 2 | 0.15 | 0.06 | 1700 | 2 |
| 12 | 0.020 | 0.021 | 0.352 | 0.474 | 0.050 | 0.022 | 0.061 | 2 | 0.2 | 0.06 | 1700 | 2 |
| 13 | 0.010 | 0.035 | 0.352 | 0.475 | 0.050 | 0.022 | 0.055 | 2 | 0.1 | 0.1 | 1700 | 2 |
| 14 | 0.018 | 0.064 | 0.320 | 0.432 | 0.046 | 0.020 | 0.100 | 2 | 0.2 | 0.2 | 1700 | 2 |
| 15 | 0.009 | 0.093 | 0.308 | 0.416 | 0.044 | 0.020 | 0.110 | 2 | 0.1 | 0.3 | 1700 | 2 |
| 16 | 0.008 | 0.117 | 0.290 | 0.392 | 0.041 | 0.018 | 0.133 | 2 | 0.1 | 0.4 | 1700 | 2 |
| 17 | 0.008 | 0.138 | 0.274 | 0.370 | 0.039 | 0.017 | 0.153 | 2 | 0.1 | 0.5 | 1700 | 2 |
| 18 | 0.007 | 0.157 | 0.260 | 0.351 | 0.037 | 0.017 | 0.171 | 2 | 0.1 | 0.6 | 1700 | 2 |
| 19 | 0.014 | 0.065 | 0.324 | 0.438 | 0.046 | 0.021 | 0.092 | 2 | 0.15 | 0.2 | 1700 | 2 |
| 20 | 0.016 | 0.114 | 0.283 | 0.382 | 0.040 | 0.018 | 0.146 | 2 | 0.2 | 0.4 | 1700 | 2 |
| 21 | 0.009 | 0.066 | 0.329 | 0.444 | 0.047 | 0.021 | 0.084 | 10 | 0.5 | 1 | 1700 | 2 |
| 22 | 0.012 | 0.066 | 0.326 | 0.440 | 0.047 | 0.021 | 0.089 | 10 | 0.65 | 1 | 1700 | 2 |
| 23 | 0.012 | 0.066 | 0.326 | 0.440 | 0.047 | 0.021 | 0.089 | 10 | 0.65 | 1 | 1700 | 2 |
| 24 | 0.015 | 0.065 | 0.323 | 0.436 | 0.046 | 0.021 | 0.094 | 10 | 0.8 | 1 | 1700 | 2 |
| 25 | 0.016 | 0.065 | 0.322 | 0.434 | 0.046 | 0.020 | 0.097 | 10 | 0.9 | 1 | 1700 | 2 |
| 26 | 0.018 | 0.064 | 0.320 | 0.432 | 0.046 | 0.020 | 0.100 | 10 | 1 | 1 | 1700 | 2 |
| 27 | 0.021 | 0.064 | 0.317 | 0.427 | 0.045 | 0.020 | 0.106 | 10 | 1.2 | 1 | 1700 | 2 |
| 28 | 0.025 | 0.063 | 0.313 | 0.423 | 0.045 | 0.020 | 0.112 | 10 | 1.4 | 1 | 1700 | 2 |

ICP elemental analysis was performed on the synthesized sample. As the result, it was confirmed that the samples of Examples 1, 4, and 9-28 included Al, N, Li, Mn, Mg, F, and O, and the sample of Examples 2 and 3 included Al, N, Li, Mn, F, and O and the sample of Examples 5 to 8 included Al, N, Mn, Mg, F, and O. Furthermore, the powder X-ray diffraction measurement (XRD) using Cu Kα line was performed on the synthesized sample. The result is shown in FIG. 1.

FIG. 1 is a diagram showing a XRD pattern of the inorganic compound of Example 1.

According to FIG. 1, a crystal having a γ-type AlON structure and a second phase constituted of aluminum oxide or aluminum nitride were confirmed. Based on height ratios of main peaks, it was determined that a production ratio of the crystal having the γ-type AlON structure was at least 90%. Here, a peak indicating a compound of Li was not detected. Similar results were derived from the XRD patterns of the other examples.

From the aforementioned, it was confirmed that the samples obtained from the Examples had the inorganic compound that included the AlON crystal including at least Mn and further Li, Mg, or F as the main component, and especially, it was found that Mn, Li, F and Mg were solid solved in the AlON crystal.

Next, it was confirmed that the inorganic compounds obtained in this way emitted light of green color, as a result, after it was irradiated by a lamp emitting light, of the wavelength of 365 nm. From this, it was shown that the samples obtained from, the Examples were the phosphors that had, as the main component, the inorganic compounds including the AlON crystal including at least Mn, and if necessary Li, Mg and F, and emitted light of green color.

Figure 2:
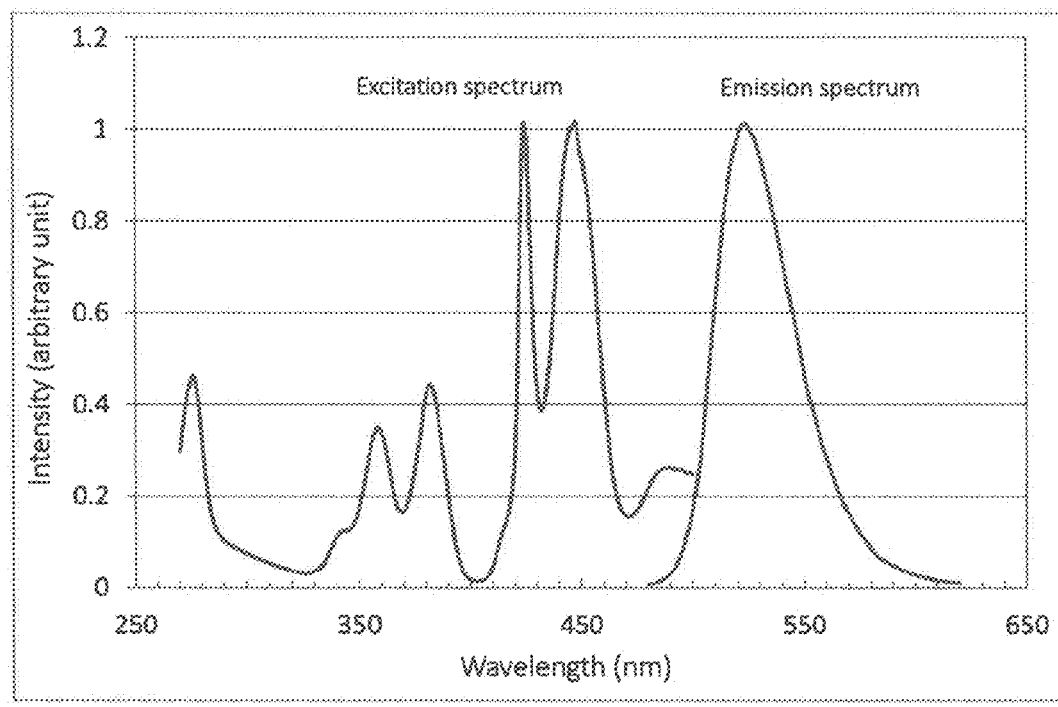
FIG. 2 is a diagram showing an excitation spectrum and an emission spectrum of the inorganic compound of Example 1.

Next, the emission spectra, and the excitation spectra of the inorganic compounds obtained from Examples 1 to 28 were measured with a spectrophotofluorometer. The results are shown in FIG. 2 and Table 3. Table 3 shows peak wavelengths at which maximum values of the excitation spectra were measured and peak wavelengths at which maximum values of the emission spectra were measured.

FIG. 2 is a diagram showing an excitation spectrum and an emission spectrum of the inorganic compound of Example 1.

TABLE 3

List of excitation wavelength and emission wavelength of phosphor in examples 1 to 28

| Example | Excitation wavelength (nm) | Emission wavelength (nm) | Emission intensity (arbitrary unit) |
|---|---|---|---|
| 1 | 447.000 | 524.000 | 1.010 |
| 2 | 447.000 | 523.000 | 0.750 |
| 3 | 447.000 | 521.000 | 0.760 |
| 4 | 447.000 | 523.000 | 0.820 |
| 5 | 424.000 | 515.000 | 0.620 |
| 6 | 424.000 | 520.000 | 0.650 |
| 7 | 424.000 | 530.000 | 0.590 |
| 8 | 446.000 | 541.000 | 0.220 |
| 9 | 424.000 | 516.000 | 0.600 |
| 10 | 424.000 | 521.000 | 0.830 |
| 11 | 424.000 | 524.000 | 0.800 |
| 12 | 424.000 | 526.000 | 0.380 |
| 13 | 447.000 | 521.000 | 0.810 |
| 14 | 424.000 | 520.000 | 0.850 |
| 15 | 447.000 | 521.000 | 0.550 |
| 16 | 447.000 | 522.000 | 0.460 |
| 17 | 447.000 | 522.000 | 0.390 |
| 18 | 447.000 | 521.000 | 0.350 |

TABLE 3-continued

List of excitation wavelength and emission wavelength of phosphor in examples 1 to 28

| Example | Excitation wavelength (nm) | Emission wavelength (nm) | Emission intensity (arbitrary unit) |
|---|---|---|---|
| 19 | 447.000 | 523.000 | 0.710 |
| 20 | 447.000 | 525.000 | 0.600 |
| 21 | 425.000 | 521.000 | 0.700 |
| 22 | 425.000 | 523.000 | 0.740 |
| 23 | 425.000 | 521.000 | 0.690 |
| 24 | 425.000 | 525.000 | 0.800 |
| 25 | 447.000 | 525.000 | 0.680 |
| 26 | 447.000 | 525.000 | 0.530 |
| 27 | 448.000 | 528.000 | 0.330 |
| 28 | 447.000 | 527.000 | 0.080 |

FIG. 2 shows an emission spectrum in the case where it was excited by light of the wavelength of 447 nm and an excitation spectrum in the case where the emission wavelength was fixed to 524 nm. According to the excitation spectrum in FIG. 2, it was confirmed that the inorganic compound of Example 1 was excited by light of the wavelength of 410 nm or longer and 470 nm or shorter. According to Table 3, it was found that the inorganic compound of Example 1 was most efficiently excited by the light of 447 nm and emitted green light having a peak at the wavelength of 524 nm. It was found that the inorganic compounds of Examples 1 to 28 were the phosphors, each of which exhibited a peak of an excitation spectrum at a wavelength in a range of 420 nm or longer and 450 nm or shorter and emitted light having a peak of fluorescence light at a wavelength in a range of 490 nm or longer and 550 nm or shorter upon excitation by light having the peak wavelength of the excitation spectrum and, in particular, was a phosphor that emitted light of high intensity having a peak at a wavelength in a range of 515 nm or longer and 541 nm or shorter and, preferably, in a range of 518 nm or longer and 530 nm or shorter.

The emission characteristics (cathodoluminescence, CL) upon electron beam irradiation were observed by SEM equipped with a CL detector, and CL images were evaluated. As a result, it was confirmed that any inorganic compound of any of the Examples was excited by the electron beam and emitted light of green color.

Example 29

In Example 29, without going through the raw material including AlON, the AlON phosphor was directly synthesized. In Example 29, the AlON phosphor not including Li, which had the same design composition as Example 5 shown in Table 2, was synthesized.

Aluminum nitride, aluminum oxide, magnesium oxide, and manganese fluoride were mixed such that the mixture had the same design composition as Example 5 as shown in Table 2 and the mixture was fired at 2000° C. for two hours in the same processes as the raw material including AlON of Example 1 was synthesized.

The emission spectrum and the excitation spectrum of the inorganic compound of Example 29 obtained in this way was measured with a spectrophotofluorometer. As a result, although the inorganic compound or Example 29 emitted light of green color, the emission intensity was lower than those of Examples 1-28.

Next, a light-emitting instrument utilizing the phosphor of the present invention will be explained.

Figure 3:
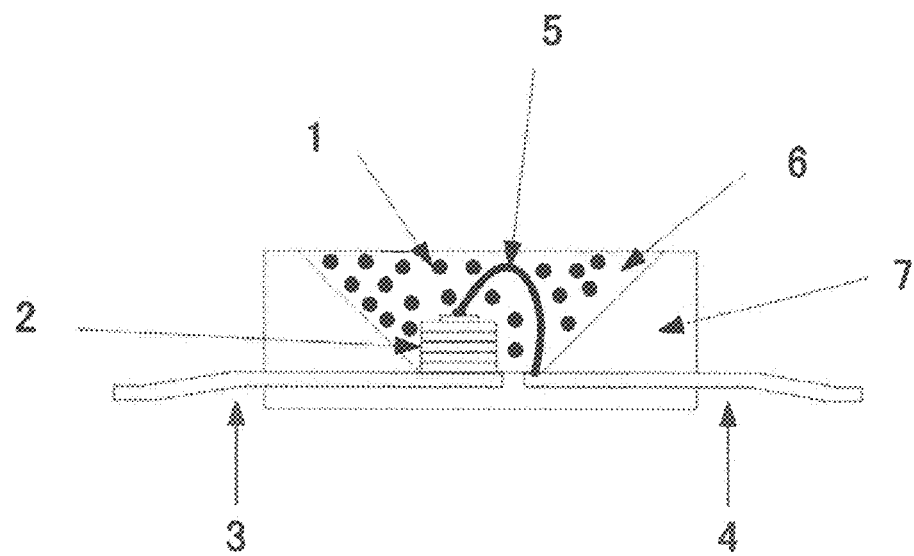
FIG. 3 is a schematic structure diagram showing a light-emitting instrument (LED light-emitting instrument) according to the present invention.

FIG. 3 shows a schematic structure diagram of the light-emitting instrument (a white LED light-emitting instrument) of the present invention.

The white LED of the present invention includes a phosphor mixture 1 that includes the phosphor of the present invention and another phosphor, and an emission source 2. Here, the phosphor mixture 1 is a mixture of the green phosphor manufactured in Example 1 of the present invention and the red phosphor of $CaAlSiN_3$: Eu. Here, the emission source 2 is a light emitting element constituted of a blue LED chip of 445 nm. The phosphor mixture 1 is dispersed in a resin layer 6, configured to cover the blue LED chip 2, and disposed in a container 7.

When current is supplied to conductive terminals 3 and 4, the current is provided to the blue LED chip 2 through a wire bond 5, light of 445 nm is emitted, and the light excites the phosphor mixture 1 of the green phosphor and the red phosphor, thereby enabling the green phosphor and the red phosphor to emit light of green color and light of red color, respectively. Mixing the green light, the red light, and the blue light emitted from the blue LED chip 2 allows she light-emitting instrument to emit light of white color and perform its function.

The light-emitting instrument of FIG. 3 is configured by utilizing the green phosphor manufactured in Example 1 and $K_2SiF_6$: Mn red phosphor as the phosphor mixture 1. In this case again, in the light-emitting instrument of the present invention, the light of 445 nm emitted by the blue LED chip 2 excites the phosphor mixture 1 of the green phosphor and the red phosphor, thereby allowing the green phosphor and the red phosphor to emit light of green color and light of red color, respectively. Mixing the green light, the red light, and the blue light emitted from the blue LED chip 2 allows the light-emitting instrument to emit light of white color and perform, its function.

Next, an image display device utilizing the phosphor of the present invention will be explained.

Figure 4:
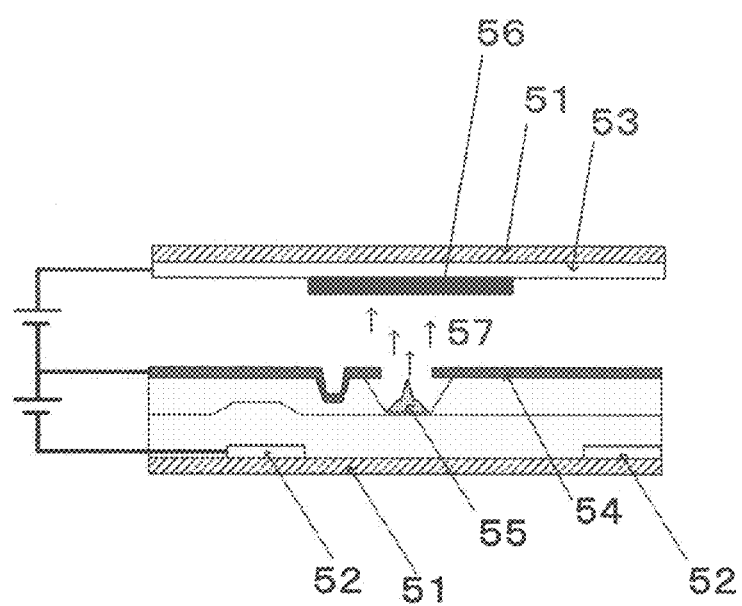
FIG. 4 is a schematic structure diagram showing an image display device (field emission display panel) according to the present invention.

FIG. 4 shows a schematic structure diagram of an image display device (field emission display panel) according to the present invention.

The image display device of the present, invention includes at least an emitter 55 as an excitation source and a green phosphor 56 manufactured in Example 1. The green phosphor 56 is applied to an interior surface of an anode 53. When a voltage is applied between a cathode 52 and a gate 54, electrons 57 are emitted from the emitter 55. The electrons 57 are accelerated by the voltage of the anode 53 and the cathode 52 so as to collide against the green phosphor 56, thereby allowing the green phosphor 56 to emit light of green color. The entire image display device of the present invention is protected by glass 51. While the drawing illustrates one light-emitting cell constituted of one emitter and one phosphor, a display is actually configured to emit light of a variety of color by arranging many cells for a blue color and a red color in addition to one for the green color. While the phosphor used for the blue and red cells are not particularly specified, a phosphor that emits light of high brightness with a low speed electron beam may be employed.

Next, another image display device utilizing the phosphor of the present invention will be explained.

Figure 5:
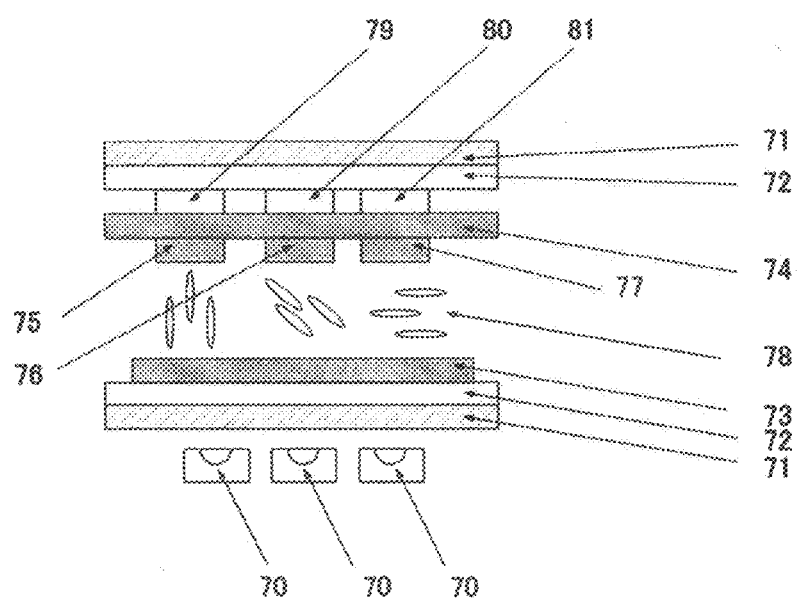
FIG. 5 is a schematic structure diagram showing an image display device (liquid crystal display panel) according to the present invention.

FIG. 5 shows a schematic structure diagram of the image display device (liquid crystal display panel) of the present invention.

The liquid crystal display panel includes a polarization filter 71, an optical shutter part including transparent electrodes 73-77 and a liquid crystal (liquid crystal molecular layer) 78, and backlight emission sources 70. A white LED having the structure as shown in FIG. 3 as the backlight emission sources 70 is utilized. In FIG. 3, a phosphor mixture 1 including the phosphor of the present invention and another phosphor, and a blue LED chip 2 emitting a peak wavelength of 450 nm as a light emitting element are used. The phosphor mixture 1 in which a green phosphor manufactured in Example 1 of the present invention and a red phosphor ($K_2SiF_6$: Mn red phosphor) as the other phosphor are dispersed in a resin layer 6 is configured to cover the blue LED chip 2, and disposed in a container 7. When current is supplied to conductive terminals 3 and 4, the current is provided to the blue LED chip 2 through a wire bond 5, light of 450 nm is emitted, the light excites the phosphor mixture 1 of the green phosphor and the red phosphor, light of green color and light of red color are emitted, respectively, and light of blue color emitted by the blue LED chip 2 is mixed with the light of green color and the light of red color such that light of white color is emitted.

In FIG. 5, the white LED chip is utilized as an LED backlight 70 being a backlight emission sources. Mixed light of red, green, and blue colors emitted by the LED backlight 70 passes through the polarization filter 71, glass substrates 72, and a transparent electrode 73 so as to reach the liquid, crystal molecular layer 78. Liquid crystal molecules provided in the liquid crystal molecular layer 78 are oriented by a voltage between a transparent electrode 73 as the common electrode and transparent electrodes 75, 76, 77 for displaying respective colors of red, green, and blue disposed on a pixel electrode 74 such that the transmittance of the light is changed. Light passing through the transparent electrodes 75, 76, 77 passes through red, green, and blue color filters 79, 80, 81 and further through a glass substrate 72 and a polarization filter 71, and then is released outside. In this way, an image is displayed.

The backlight emission sources 70 are constituted of sharp spectra of light components of blue color, green color, and red color and has good optical resolution when it is spectrally dispersed, by the polarization filter 71 such that separated light has high color purity at the chromaticity point of red, green, or blue in the chromaticity coordinates. In this way, the color space (color gamut) which is reproducible by the liquid crystal display becomes wider such that a liquid crystal panel having high color reproducibility may be provided.

INDUSTRIAL APPLICABILITY

The phosphor of the present invention exhibits green color emission with high color purity, and shows little degradation in brightness of fluorescence in the case of being exposed to the excitation source such that it is suitably utilized for the VFD, the FED, the PDP, the CRT, the white LED, and the like. In the future, it is expected that the phosphor of the present invention will be extensively utilized in the backlight LED and various kinds of display devices with an electron beam excitation, thereby contributing to the development of the industry.

EXPLANATION OF NUMERALS 1 phosphor mixture of red phosphor and phosphor of the present invention
2 blue LED chip,
3, 4 electrically conductive terminal,
5 wire bond,
6 resin layer, 7 container,
51 glass,
52 cathode,
53 anode,
54 gate,
55 emitter,
56 phosphor,
57 electrons,
70 LED backlight (backlight emission source)
71 polarization filter
72 glass substrate
73 transparent electrode (common electrode)
74 transparent electrode (pixel electrode)
75 transparent electrode (for red color display)
76 transparent electrode (for green color display)
77 transparent electrode (for blue color display)
78 liquid crystal molecular layer
79 color filter (for red color display)
80 color filter (for green color display)
81 color filter (for blue color display)

What is claimed is:

1. A light-emitting instrument comprising: at least an emission source that emits light having a wavelength of 410 nm or longer and 470 nm or shorter and a phosphor or a light transmitting body in which a phosphor is dispersed
wherein the phosphor includes an inorganic compound in which an AlON crystal, an AlON solid solution crystal, or an inorganic crystal having an identical crystal structure to that of the AlON crystal includes at least Mn, an A element if necessary (where the A element is a monovalent metal element), a D element if necessary (where the D element is a divalent metal element), an E element if necessary (where the E element is F), and a G element if necessary (where the G element is one or two or more kinds of elements other than Mn, the A element, Al, 0, N, the D element, and the E element) and emits fluorescence having a peak at a wavelength in a range from 515 nm to 541 nm upon irradiation of the excitation source, and
wherein the phosphor is represented by a composition formula: $Mn_aA_bAl_cO_dN_eD_fE_gG_h$ (where a+b+c+d+e+f+g+h=1 in the formula) and the parameters: a, b, c, d, e, f, g, and h satisfy:

$0.0003 \leq a \leq 0.09$, $0 \leq b \leq 0.24$, $0.25 \leq c \leq 0.41$, $0.35 \leq d \leq 0.56$, $0.02 \leq e \leq 0.13$, $0 \leq f \leq 0.10$, $0.001 \leq g \leq 0.17$, and $0 \leq h \leq 0.10$.

2. The light-emitting instrument according to claim 1, wherein the A element is Li and
the parameter a satisfies $0.005 \leq a \leq 0.025$.

3. The light-emitting instrument according to claim 1, wherein the D element is Mg and
the parameter f satisfies $0.001 \leq f \leq 0.09$.

4. The light-emitting instrument according to claim 1, wherein the parameter h satisfies h=0.

5. The light-emitting instrument according to claim 1, wherein the emission source is an LED (light-emitting diode) or an LD (laser diode) to emit light having a peak at a wavelength in a range from 430 to 460 nm.

6. The light-emitting instrument according to claim 1, wherein the emission source is an LED (light-emitting diode) or an LD (laser diode) to emit light having a peak at a wavelength in a range from 440 to 460 nm and the phosphor emits fluorescence having a peak at a wavelength in a range of 518 nm or longer and 530 nm or shorter upon irradiation of the excitation source.

7. The light-emitting instrument according to claim 1, further comprising: a red phosphor to emit light having a peak at a wavelength in a range of 620 nm or longer and 670 nm or shorter.

8. The light-emitting instrument according to claim 7, wherein the red phosphor is a phosphor activated by $Mn^{4+}$.

9. The light-emitting instrument according to claim 8, wherein the red phosphor is KSF and/or KSNAF.

10. An image display device utilizing at least a light-emitting instrument as a backlight wherein the light-emitting instrument comprises a light-emitting instrument recited in claim 1.

* * * * *